(12) United States Patent
Sato (10) Patent No.: US 12,196,628 B2
(45) Date of Patent: Jan. 14, 2025

(54) STRAIN GAUGE AND SENSOR MODULE

(71) Applicant: MINEBEA MITSUMI Inc., Nagano (JP)

(72) Inventor: Satoshi Sato, Kanagawa (JP)

(73) Assignee: MINEBEA MITSUMI Inc., Nagano (JP)

( * ) Notice: Subject to any disclaimer, the term of this patent is extended or adjusted under 35 U.S.C. 154(b) by 189 days.

(21) Appl. No.: 17/754,317

(22) PCT Filed: Aug. 4, 2020

(86) PCT No.: PCT/JP2020/029797
§ 371 (c)(1),
(2) Date: Mar. 30, 2022

(87) PCT Pub. No.: WO2021/065188
PCT Pub. Date: Apr. 8, 2021

(65) Prior Publication Data
US 2022/0390301 A1 Dec. 8, 2022

(30) Foreign Application Priority Data

Oct. 1, 2019 (JP) ................. 2019-181206

(51) Int. Cl.
*G01L 1/22* (2006.01)
*G01B 7/16* (2006.01)
*H05K 1/16* (2006.01)
*H05K 1/18* (2006.01)

(52) U.S. Cl.
CPC ............ *G01L 1/2287* (2013.01); *H05K 1/189* (2013.01); *G01B 7/16* (2013.01); *G01B 7/18* (2013.01); *G01L 1/22* (2013.01); *H05K 1/16* (2013.01); *H05K 1/167* (2013.01); *H05K 2201/09263* (2013.01); *H05K 2201/10151* (2013.01)

(58) Field of Classification Search
CPC ......... G01L 1/2287; G01L 1/22; H05K 1/189; H05K 1/167; H05K 1/16; H05K 2201/10151; H05K 2201/09263; G01B 7/16; G01B 7/18
See application file for complete search history.

(56) References Cited

U.S. PATENT DOCUMENTS

| 7,812,261 B2* | 10/2010 | Yamashita | ........... H05K 1/0271 174/259 |
| 11,087,905 B2* | 8/2021 | Asakawa | .............. G01L 1/2287 |
| 11,454,488 B2* | 9/2022 | Asakawa | ................. G01B 7/18 |

(Continued)

FOREIGN PATENT DOCUMENTS

| JP | S56-092403 | 7/1981 |
| JP | H07-020721 U | 4/1995 |

(Continued)

OTHER PUBLICATIONS

International Search Report of Int. Appl. No. PCT/JP2020/029797 dated Oct. 6, 2020.

*Primary Examiner* — Jonathan M Dunlap
(74) *Attorney, Agent, or Firm* — IPUSA, PLLC (57) ABSTRACT

A strain gauge includes a substrate made from resin and having flexibility, a resistor formed on one surface of the substrate, and an insulating resin layer covering the resistor, wherein the insulating resin layer is a thermoplastic polyimide layer.

6 Claims, 5 Drawing Sheets

(56) References Cited

U.S. PATENT DOCUMENTS

| | | | | |
|---|---|---|---|---|
| 11,542,590 B2* | 1/2023 | Asakawa | ............ | C23C 14/0063 |
| 11,543,309 B2* | 1/2023 | Misaizu | ................ | G01L 1/2287 |
| 11,692,806 B2* | 7/2023 | Misaizu | .................. | G01B 7/18 |
| | | | | 73/763 |
| 11,747,225 B2* | 9/2023 | Asakawa | .............. | G01L 1/2287 |
| | | | | 73/862.627 |
| 11,774,303 B2* | 10/2023 | Kitamura | ................. | G01B 7/20 |
| | | | | 73/849 |
| 2005/0155435 A1* | 7/2005 | Ziebart | ................. | G01G 21/00 |
| | | | | 73/781 |
| 2006/0014403 A1 | 1/2006 | Sakurai et al. | | |
| 2018/0217016 A1* | 8/2018 | Inamori | .................... | G01L 1/22 |
| 2019/0376857 A1 | 12/2019 | Akata et al. | | |
| 2020/0271533 A1* | 8/2020 | Yuguchi | ................... | H01C 1/14 |
| 2021/0055095 A1 | 2/2021 | Asakawa et al. | | |

FOREIGN PATENT DOCUMENTS

| | | |
|---|---|---|
| JP | 2006-032590 | 2/2006 |
| JP | 2016-074934 | 5/2016 |
| JP | 2017-067764 | 4/2017 |
| JP | 2018-138890 | 9/2018 |
| JP | 2019-128183 | 8/2019 |

* cited by examiner

STRAIN GAUGE AND SENSOR MODULE

TECHNICAL FIELD

The present invention relates to a strain gauge and a sensor module.

BACKGROUND ART

A strain gauge is known to be attached to an object to detect strain on the object. The strain gauge includes a resistor for detecting strain, and as a resistor material, for example, material including Cr (chromium) or Ni (nickel) is used. The resistor is formed on a substrate and is covered with an insulating resin layer serving as a protective film (see, for example, Patent document 1).

CITATION LIST

Patent Document

[Patent document 1] Japanese Unexamined Patent Application Publication No. 2016-74934

SUMMARY

Technical Problem

However, the above-described strain gauge has a problem in that the work efficiency is poor when an insulating resin layer side, which is the protective film, is attached to an object such as a flexure element and a circuit board. Specifically, a step of applying an adhesive to the object and a step of removing excess adhesive from the object are required, which reduces the work efficiency.

The present invention has been made in view of the above-described problem, and it is an object of the present invention to provide a strain gauge capable of improving the work efficiency when the insulating resin layer side is attached to an object such as a flexure element and a circuit board.

Solution to Problem

A strain gauge according to the present invention includes a substrate made from resin and having flexibility, a resistor formed on one surface of the substrate, and an insulating resin layer covering the resistor, wherein the insulating resin layer is a thermoplastic polyimide layer.

Advantageous Effects of Invention

According to the disclosed technique, a strain gauge capable of improving the work efficiency when an insulating resin layer side is attached to an object such as a flexure element and a circuit board can be provided.

DESCRIPTION OF EMBODIMENTS

Hereinafter, embodiments for carrying out the invention will be described with reference to the drawings. In the drawings, the same components may be denoted with the same reference numerals and duplicate explanation thereabout may be omitted.

First Embodiment

Figure 1:
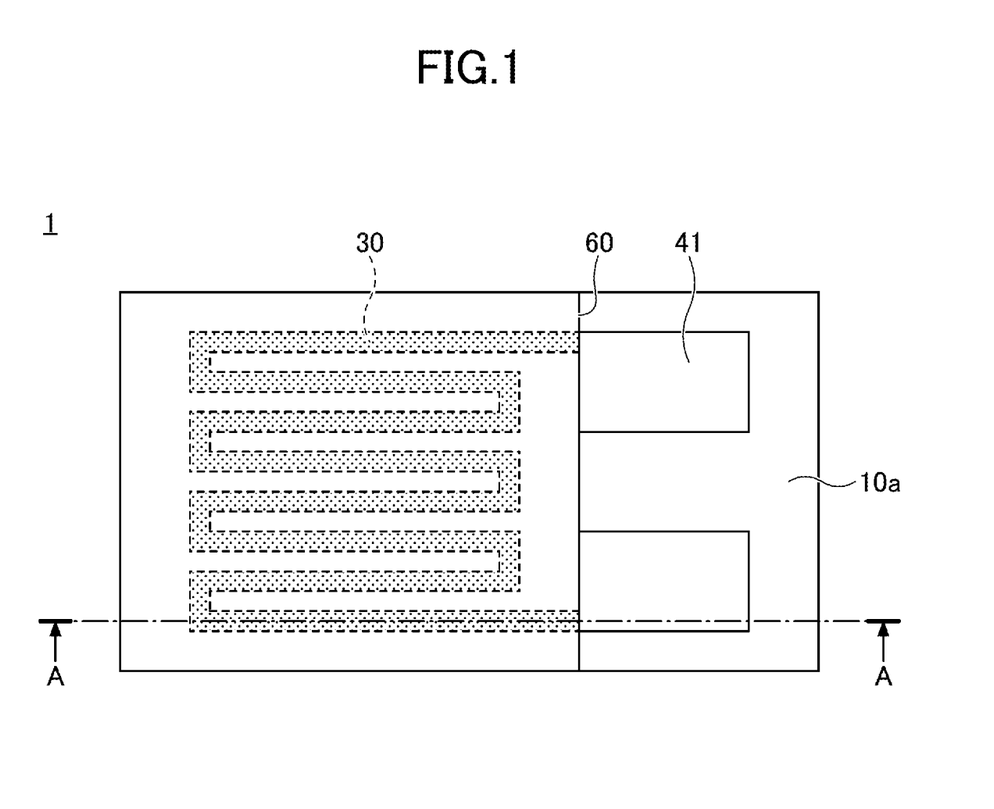
FIG. 1 is a plan view of an example of a strain gauge according to a first embodiment.
Figure 2:
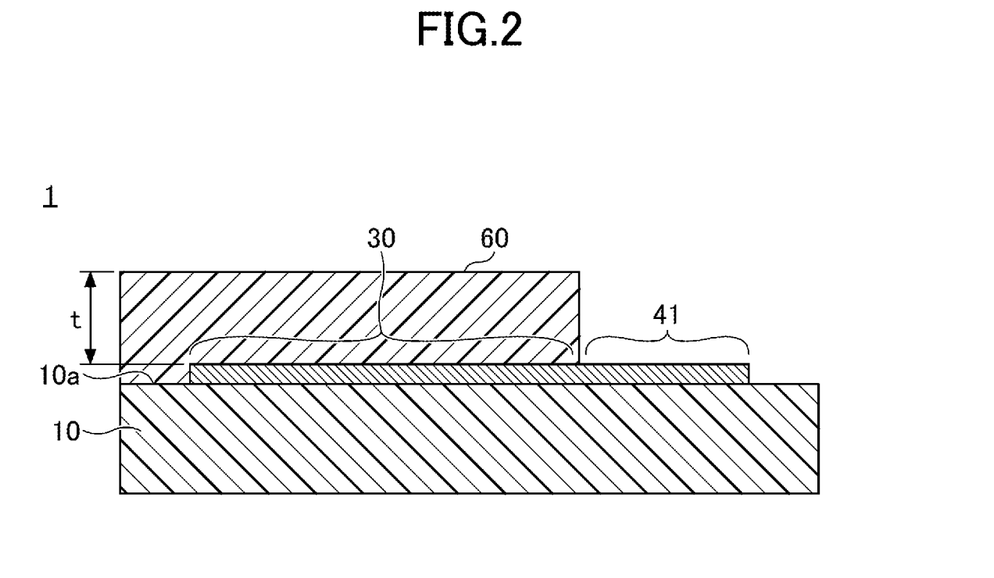
FIG. 2 is a cross-sectional view (part 1) of an example of the strain gauge according to the first embodiment.

FIG. 1 is a plan view of an example of a strain gauge according to a first embodiment. FIG. 2 is a cross-sectional view of an example of the strain gauge according to the first embodiment, and illustrates a cross section taken along the A-A line in FIG. 1. With reference to FIGS. 1 and 2, the strain gauge 1 includes a substrate 10, a resistor 30, and terminal sections 41, and an insulating resin layer 60.

Note that in the present embodiment, for the sake of convenience, with respect to the strain gauge 1, the side of the substrate 10 where the resistor 30 is provided is referred to as an upper side or one side; and the side of the substrate 10 where the resistor 30 is not provided is referred to as a lower side or another side. Further, for each component, the surface on the side where the resistor 30 is provided is referred to as one surface or an upper surface; and the surface on the side where the resistor 30 is not provided is referred to as another surface or a lower surface. However, the strain gauge 1 can be used in a state of being upside down, or be disposed at any angle. Further, a plan view means that an object is viewed from a normal direction of an upper surface 10a of the substrate 10, and a planar shape refers to a shape of an object when viewed from the normal direction of the upper surface 10a of the substrate 10.

The substrate 10 is a member that is a base layer for forming the resistor 30 or the like and is flexible. The thickness of the substrate 10 is not particularly restricted, and can be appropriately selected for any purpose. For example, such a thickness can be approximately between 5 μm and 500 μm. In particular, when the thickness of the substrate 10 is between 5 μm and 200 μm, it is preferable in terms of dimensional stability with respect to environment, and when the thickness is 10 μm or more, it is further preferable in terms of insulation.

The substrate 10 can be formed of an insulating resin film such as a PI (polyimide) resin, an epoxy resin, a PEEK (polyether ether ketone) resin, a PEN (polyethylene naphthalate) resin, a PET (polyethylene terephthalate) resin, a PPS (polyphenylene sulfide) resin, or a polyolefin resin. Note that the film refers to a flexible member having a thickness of about 500 μm or less.

Here, the "formed of an insulating resin film" is not intended to preclude the substrate 10 from containing fillers, impurities, or the like in the insulating resin film. The substrate 10 may be formed of, for example, an insulating resin film containing fillers such as silica or alumina.

The resistor 30 is a thin film formed in a predetermined pattern and is a sensitive section where resistance varies according to strain. The resistor 30 may be formed directly on the upper surface 10a of the substrate 10, or be formed above the upper surface 10a of the substrate 10, via other layer(s). Note that in FIG. 1, for the sake of convenience, the resistor 30 is illustrated in a crepe pattern.

The resistor 30 can be formed of, for example, material including Cr (chromium); material including Ni (nickel); or material including both of Cr and Ni. In other words, the resistor 30 can be formed of material including at least one from among Cr and Ni. An example of the material including Cr includes a Cr composite film. An example of the material including nickel includes Cu—Ni (copper nickel). An example of the material including both of Cr and Ni includes Ni—Cr (nickel chromium).

Here, the Cr composite film is a composite film of Cr, CrN, $Cr_2N$, and the like. The Cr composite film may include incidental impurities such as chromium oxide.

The thickness of the resistor 30 is not particularly restricted, and can be appropriately selected for any purpose. The thickness can be, for example, approximately between 0.05 μm and 2 μm. In particular, when the thickness of the resistor 30 is 0.1 μm or more, it is preferable in terms of improvement in crystallinity (e.g., crystallinity of α-Cr) of a crystal that constitutes the resistor 30. When the thickness of the resistor 30 is 1 μm or less, it is further preferable in terms of reduction in cracks of a given film caused by internal stress of the film that constitutes the resistor 30, or reduction in warp in the substrate 10.

For example, when the resistor 30 is the Cr composite film, the resistor is formed with α-Cr (alpha-chromium) as the main component having a stable crystalline phase, so that stability of the gauge characteristics can be improved. Additionally, when the resistor 30 is formed with α-Cr as the main component, the gauge factor of the strain gauge 1 can be 10 or more, as well as a gauge factor temperature coefficient TCS and temperature coefficient of resistance TCR can be each in the range of from −1000 ppm/° C. to +1000 ppm/° C. Here, the basis means that a target substance has 50% by weight or more of total substances that constitute the resistor. The resistor 30 preferably includes α-Cr of 80% by weight or more, from the viewpoint of improving the gauge characteristics. Note that α-Cr is Cr having a bcc structure (body-centered cubic structure).

The terminal sections 41 respectively extend from both end portions of the resistor 30 and are each wider than the resistor 30 to be in an approximately rectangular shape, in a plan view. The terminal sections 41 are a pair of electrodes from which a change in a resistance value of the resistor 30 according to strain is output externally, where, for example, a lead wire for an external connection, or the like is joined. For example, the resistor 30 extends zigzagged back and forth from one of the terminal sections 41 to another terminal section 41. The upper surface of each terminal section 41 may be coated with a metal allowing for better solderability than the terminal section 41. Note that for the sake of convenience, the resistor 30 and the terminal sections 41 are expressed by different numerals. However, the resistor and the terminal sections can be integrally formed of the same material, in the same process.

An insulating resin layer 60 (insulating resin layer) may be disposed on and above the upper surface 10a of the substrate 10, such that the resistor 30 is coated and the terminal sections 41 are exposed. The insulating resin layer 60 functions as a fusing layer for attaching the strain gauge 1 to a flexure element. With the insulating resin layer 60 being provided, mechanical damage, and the like can be prevented from occurring in the resistor 30. Additionally, with the insulating resin layer 60 being provided, the resistor 30 can be protected against moisture, and the like. Note that the insulating resin layer 60 may be provided to cover the entire portion except for the terminal sections 41.

The insulating resin layer 60 is a thermoplastic polyimide layer. The thickness t of the insulating resin layer 60 (the thickness of a portion laminated on the resistor 30) is preferably 5 μm or more and 7 μm or less. The reason for this is as follows.

Because the thermoplastic polyimide layer is difficult to be formed thickly due to manufacturing restrictions, the thickness of the thermoplastic polyimide layer is preferably less than 10 μm. Furthermore, when the strain gauge 1 is attached to the flexure element, a distance between the resistor 30 and the flexure element (i.e., the thickness of the thermoplastic polyimide layer) affects the detection sensitivity, and therefore, the thickness of the thermoplastic polyimide layer is preferably thinner. According to the study of the inventor, when the thickness of the thermoplastic polyimide layer is 7 μm or less, transmission property of distortion from the flexure element surface is good, and strain can be detected with a sufficiently high sensitivity. Therefore, when the thickness of the thermoplastic polyimide layer is 7 μm or less, manufacturing restrictions can be satisfied, and the sensitivity is sufficiently high.

In a case where the flexure element is a conductor, the thermoplastic polyimide layer also serves as an insulating layer for insulation between the flexure element and the resistor 30. When the thickness of the thermoplastic polyimide layer is 5 μm or more, a sufficient insulating property can be obtained, but when the thickness of the thermoplastic polyimide layer is less than 5 μm, the insulating property decreases due to occurrence of pinholes. Furthermore, when the thickness of the thermoplastic polyimide layer is 5 μm or more, a sufficient bonding strength can be obtained.

In this manner, the thickness t of the insulating resin layer 60, i.e., the thermoplastic polyimide layer, is preferably 5 μm or more and 7 μm or less. When the thickness t of the insulating resin layer 60 is within this range, strain can be detected with a sufficiently high sensitivity, manufacturing requirements are also satisfied, and a sufficient insulating property and bonding strength can be obtained.

The thermoplastic polyimide layer may include not only thermoplastic polyimide but also a resin and/or a filler other than thermoplastic polyimide. Because thermoplastic polyimide is expensive, the cost of the materials for the strain gauge 1 can be reduced when the thermoplastic polyimide layer includes a resin and/or a filler that are of a low cost.

Examples of resins other than thermoplastic polyimide that is included in the thermoplastic polyimide layer include epoxy resin, phenol resin, oxetane resin, and the like. Furthermore, engineering plastics such as polybutylene terephthalate (PBT), polyphenylene sulfide (PPS), polyether sulfone (PES), and polyetherimide (PEI) may be used.

The thermoplastic polyimide layer containing epoxy resin can be obtained by mixing and heating polyamic acid and epoxy resin. The thermoplastic polyimide layer containing epoxy resin thus obtained has an advantage of having a higher bonding strength than a thermoplastic polyimide layer that does not contain epoxy resin.

Examples of fillers include inorganic fine particles such as aluminum oxide, titanium oxide, boron nitride, and silicon oxide. The linear expansion coefficient of the insulating resin layer 60 can be adjusted by having the thermoplastic polyimide layer contain inorganic fine particles at an appropriate ratio.

Residual stress may occur in the insulating resin layer 60, and therefore, a linear expansion coefficient of the insulating resin layer 60 is preferably a value close to the linear expansion coefficient of the flexure element to which the strain gauge 1 is attached, so that the residual stress is alleviated. Accordingly, the linear expansion coefficient of the thermoplastic polyimide layer containing inorganic fine particles can be adjusted according to the amount of contained inorganic fine particles, and therefore, the thermoplastic polyimide layer containing inorganic fine particles is preferable as a material of the material for the insulating resin layer 60.

In order to manufacture the strain gauge 1, first, the substrate 10 is prepared and the resistor 30 and the terminal sections 41 each of which has the planar shape illustrated in FIG. 1 are formed on the upper surface 10a of the substrate. The material and thickness for each of the resistor 30 and the terminal sections 41 are the same as the material and thickness described above. The resistor 30 and the terminal sections 41 can be integrally formed of the same material.

The resistor 30 and the terminal sections 41 are formed, for example, such that a raw material capable of forming the resistor 30 and the terminal sections 41 is the target to be deposited by magnetron sputtering, and such that patterning is performed by photolithography. Instead of the magnetron sputtering, the resistor 30 and the terminal sections 41 may be deposited by reactive sputtering, vapor deposition, arc ion plating, pulsed laser deposition, or the like.

From the viewpoint of stabilizing the gauge characteristics, before depositing the resistor 30 and the terminal sections 41, preferably, as a base layer, a functional layer having a film thickness that is approximately between 1 nm and 100 nm is vacuum-deposited on the upper surface 10a of the substrate 10, by conventional sputtering, for example. Note that, after forming the resistor 30 and the terminal sections 41 on the entire upper surface of the functional layer, the functional layer, as well as the resistor 30 and the terminal sections 41, are patterned in the planar shape illustrated in FIG. 1, by photolithography.

In the present application, the functional layer refers to a layer that has a function of promoting crystal growth of the resistor 30 that is at least an upper layer. The functional layer preferably further has a function of preventing oxidation of the resistor 30 caused by oxygen and moisture included in the substrate 10, as well as a function of improving adhesion between the substrate 10 and the resistor 30. The functional layer may further have other functions.

The insulating resin film that constitutes the substrate 10 contains oxygen and moisture. In this regard, particularly when the resistor 30 includes Cr, it is effective for the functional layer to have a function of preventing oxidation of the resistor 30, because Cr forms an autoxidized film.

The material of the functional layer is not particularly restricted as long as it is material having a function of promoting crystal growth of the resistor 30 that is at least an upper layer. Such material can be appropriately selected for any purpose, and includes one or more types of metals selected from a group consisting of, for example, Cr (chromium), Ti (titanium), V (vanadium), Nb (niobium), Ta (tantalum), Ni (nickel), Y (yttrium), Zr (zirconium), Hf (hafnium), Si (silicon), C (carbon), Zn (zinc), Cu (copper), Bi (bismuth), Fe (iron), Mo (molybdenum), W (tungsten), Ru (ruthenium), Rh (rhodium), Re (rhenium), Os (osmium), Ir (iridium), Pt (platinum), Pd (palladium), Ag (silver), Au (gold), Co (cobalt), Mn (manganese), and Al (aluminum); an alloy of any metals from among the group; or a compound of any metal from among the group.

Examples of the above alloy include FeCr, TiAl, FeNi, NiCr, CrCu, and the like. Examples of the above compound include TiN, TaN, $Si_3N_4$, $TiO_2$, $Ta_2O_5$, $SiO_2$, and the like.

The functional layer can be vacuum-deposited by, for example, conventional sputtering in which a raw material capable of forming the functional layer is the target and in which an Ar (argon) gas is supplied to a chamber. By using conventional sputtering, the functional layer is deposited while the upper surface 10a of the substrate 10 is etched with Ar. Thus, a deposited amount of film of the functional layer is minimized and thus an effect of improving adhesion can be obtained.

However, this is an example of a method of depositing the functional layer, and the functional layer may be formed by other methods. For example, before depositing the functional layer, the upper surface 10a of the substrate 10 is activated by plasma treatment, etc. using Ar, or the like to thereby obtain the effect of improving the adhesion; subsequently, the functional layer may be vacuum-deposited by magnetron sputtering.

A combination of the material of the functional layer and the material of the resistor 30 and the terminal sections 41 is not particularly restricted, and can be appropriately selected for any purpose. For example, Ti is used for the functional layer, and a Cr composite film formed with α-Cr (alpha-chromium) as the main component can be deposited as the resistor 30 and the terminal sections 41.

In this case, each of the resistor 30 and the terminal sections 41 can be deposited by, for example, magnetron sputtering in which a raw material capable of forming the Cr composite film is the target and in which an Ar gas is supplied to a chamber. Alternatively, the resistor 30 and the terminal sections 41 may be deposited by reactive sputtering in which pure Cr is the target and in which an appropriate amount of nitrogen gas, as well as an Ar gas, are supplied to a chamber.

In such methods, a growth face of the Cr composite film is defined by the functional layer formed of Ti, and a Cr composite film that is formed with α-Cr as the main component having a stable crystalline structure can be deposited. Also, Ti that constitutes the functional layer is diffused into the Cr composite film, so that the gauge characteristics are improved. For example, the gauge factor of the strain gauge 1 can be 10 or more, as well as the gauge factor temperature coefficient TCS and temperature coefficient of resistance TCR can be each in the range of from −1000 ppm/° C. to +1000 ppm/° C. Note that, when the functional layer is formed of Ti, the Cr composite film may include Ti or TiN (titanium nitride).

Note that when the resistor 30 is a Cr composite film, the functional layer formed of Ti includes all functions being a function of promoting crystal growth of the resistor 30; a function of preventing oxidation of the resistor 30 caused by oxygen or moisture contained in the substrate 10; and a function of improving adhesion between the substrate 10 and the resistor 30. Instead of Ti, when the functional layer is formed of Ta, Si, Al, or Fe, the functional layer also includes the same functions.

As described above, with the functional layer being provided in the lower layer of the resistor 30, the crystal growth of the resistor 30 can be promoted and thus the resistor 30 having a stable crystalline phase can be fabricated. As a result, with respect to the strain gauge 1, the stability of the gauge characteristics can be improved. Also, the material that constitutes the functional layer is diffused into the resistor 30, so that the gauge characteristics of the strain gauge 1 can be thereby improved.

After the resistor 30 and the terminal section 41 are formed, the insulating resin layer 60 that covers the resistor 30 and exposes the terminal section 41 is provided on the upper surface 10a of the substrate 10. As a result, the strain gauge 1 is completed.

For example, the insulating resin layer 60 can be formed on the substrate 10 by applying the resistor 30 to the upper surface 10a of the substrate 10, applying thermoplastic polyimide varnish to expose the terminal section 41, and firing the thermoplastic polyimide varnish. Note that the thermoplastic polyimide varnish may contain resin and/or filler other than thermoplastic polyimide. Alternatively, instead of thermoplastic polyimide varnish, thermoplastic polyamic acid varnish may be used.

Figure 3:
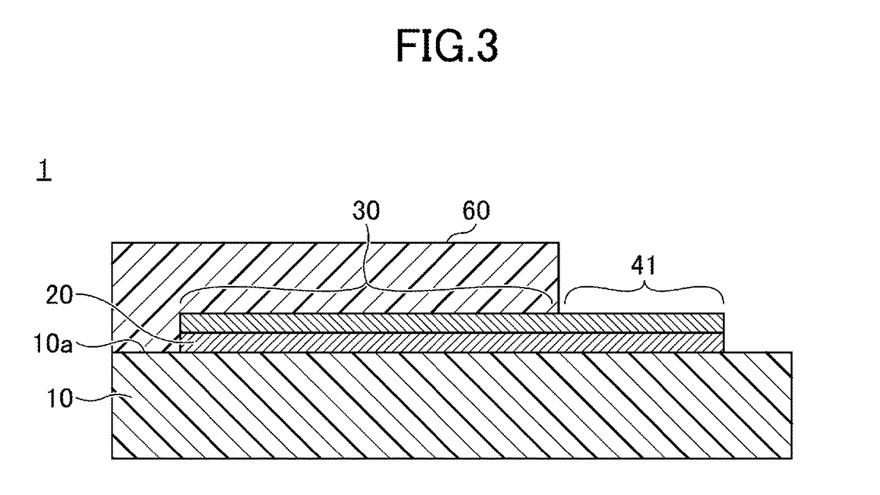
FIG. 3 is a cross-sectional view (part 2) of an example of the strain gauge according to the first embodiment.

Note that when the functional layer, as a base layer of the resistor 30 and the terminal sections 41, is provided on the upper surface 10a of the substrate 10, the strain gauge 1 has a cross-section shape illustrated in FIG. 3. A layer expressed by the numeral 20 indicates the functional layer. The planar shape of the strain gauge 1 in the case of providing the functional layer 20 is the same as in FIG. 1.

In this manner, in the strain gauge 1, the insulating resin layer 60 is a thermoplastic polyimide layer. Therefore, the work efficiency can be improved when the insulating resin layer 60 side is attached to an object such as a flexure element and a circuit board.

Specifically, attachment of the insulating resin layer 60 side of the strain gauge 1 to the object such as a flexure element and a circuit board can be performed simply by bringing the insulating resin layer 60 into contact with the object, heating and pressurizing the strain gauge 1 at the same time, and subsequently cooling the strain gauge 1. Accordingly, the strain gauge 1 can be fixed to the object with a high bonding strength.

Therefore, a step of applying an adhesive to the strain gauge and the object and a step of removing excess adhesive from contact surfaces of the strain gauge and the object are not necessary. For this reason, as compared with the conventional process using a thermosetting adhesive for bonding the strain gauge 1 and the object, attachment with the object can be efficiently performed in a shorter period of time.

Second Embodiment

In the second embodiment, an example of a sensor module in which a strain gauge is pasted to a flexure element is shown. Specifically, the second embodiment is an example where an object to which the strain gauge according to the first embodiment is attached is a flexure element. In the second embodiment, explanation about substantially the same components as in the above-described embodiment may be omitted.

Figure 4:
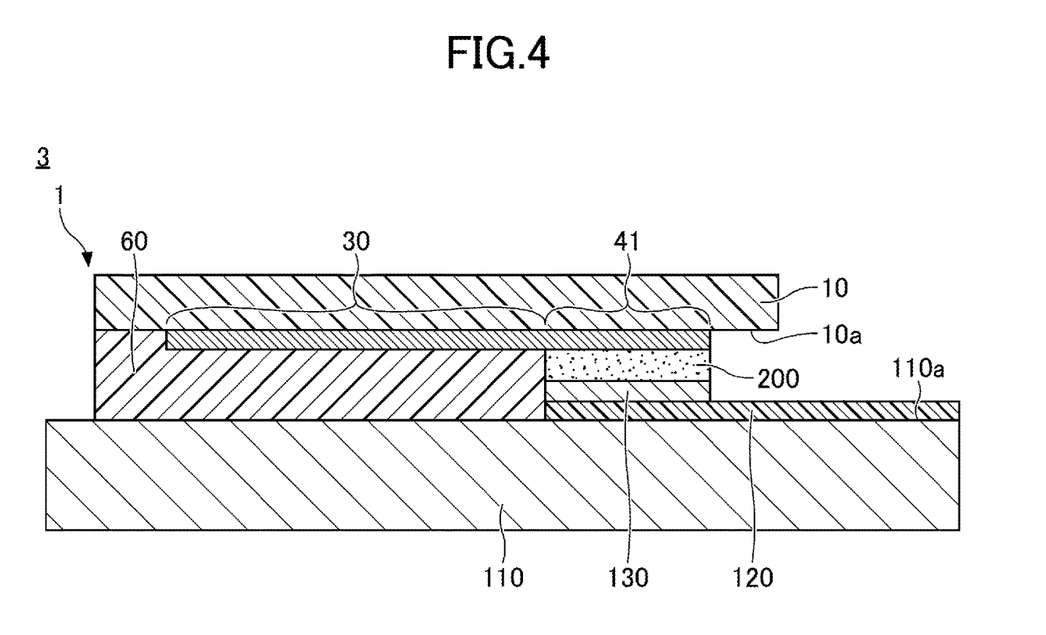
FIG. 4 is a cross-sectional view illustrating an example of a sensor module according to a second embodiment.

FIG. 4 is a cross-sectional view illustrating an example of the sensor module according to the second embodiment. As shown in FIG. 4, a sensor module 3 includes a strain gauge 1 and a flexure element 110. A flexible print circuit board 120 is pasted to an upper surface 110a of the flexure element 110 with an adhesive or the like, and an electrode 130 is formed on the flexible print circuit board 120.

In the sensor module 3, the strain gauge 1 is fixed to the upper surface 110a of the flexure element 110, with the substrate 10 facing a side opposite from the flexure element 110. More specifically, the insulating resin layer 60 of the strain gauge 1 is fused to the upper surface 110a of the flexure element 110.

The flexure element 110 is an object made from, for example, metal such as Fe, SUS (stainless steel), and Al, or resin such as PEEK, that deforms in response to an applied force and transmits the generated strain to the strain gauge 1. The strain gauge 1 can detect the strain generated in the flexure element 110 as a change in the resistance value of the resistor 30.

For example, the flexure element 110 is a plate-shaped member, but is not limited thereto. The flexure element 110 may be in various shapes such as a Roberval shape, ring shape, and the like. Furthermore, any number of strain gauges 1 may be attached to the flexure element 110.

The terminal section 41 of the strain gauge 1 is electrically connected to the electrode 130 on the flexible print circuit board 120 via a conductive adhesive layer 200. For example, the conductive adhesive layer 200 is an anisotropic conductive film (ACF). When the anisotropic conductive film is used as the conductive adhesive layer 200, the terminal section 41 and the electrode 130 can be readily connected, and therefore, as compared with the case where they are connected with a solder or the like, the work efficiency can be improved greatly.

In order to manufacture the sensor module 3, first, the strain gauge 1 is placed at the position indicated in FIG. 4 on the upper surface 110a of the flexure element 110. Then, pressurizing and heating are performed in the state as illustrated in FIG. 4, so that the strain gauge 1 is fused to the upper surface 110a of the flexure element 110 via the insulating resin layer 60. Then, the terminal section 41 and the electrode 130 are bonded with the conductive adhesive layer 200.

FIG. 5A to FIG. 5D are drawings illustrating the example of procedure for fusing the strain gauge to the flexure element.

Figure 5A:
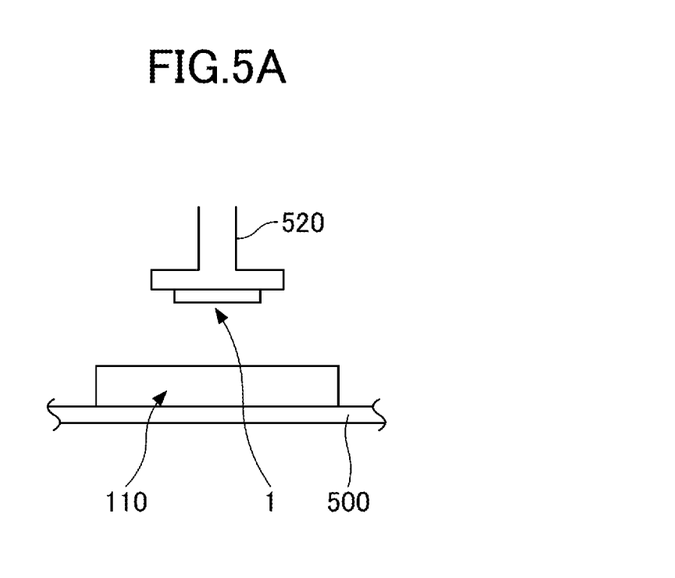
FIG. 5A is a drawing illustrating an example of a procedure for fusing a strain gauge to a flexure element (part 1).

First, as illustrated in FIG. 5A, the strain gauge 1 held by a jig 520 is brought into proximity to the flexure element 110 placed on a conveyor 500. An anisotropic conductive film, which is to be the conductive adhesive layer 200, is placed in advance on the electrode 130 of the flexure element 110.

Figure 5B:
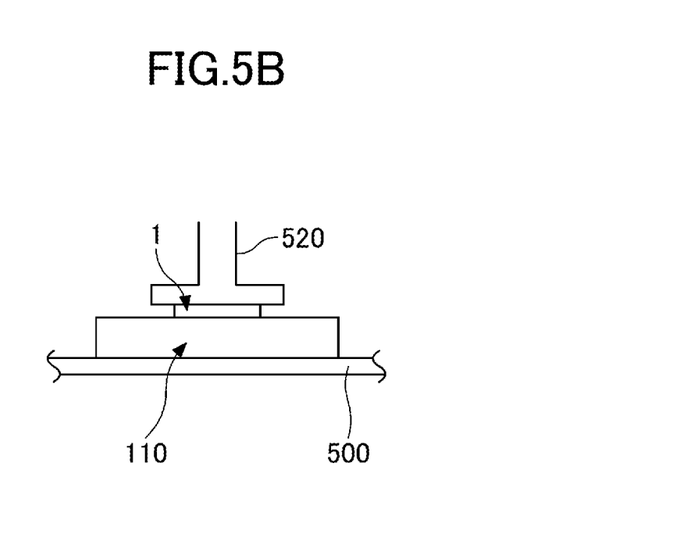
FIG. 5B is a drawing illustrating the example of a procedure for fusing the strain gauge to the flexure element (part 2).

Subsequently, as illustrated in FIG. 5B, the insulating resin layer 60 of the strain gauge 1 is brought into contact with the upper surface 110a of the flexure element 110, and the terminal section 41 of the strain gauge 1 is brought into contact with the anisotropic conductive film placed on the electrode 130 of the flexure element 110.

Figure 5C:
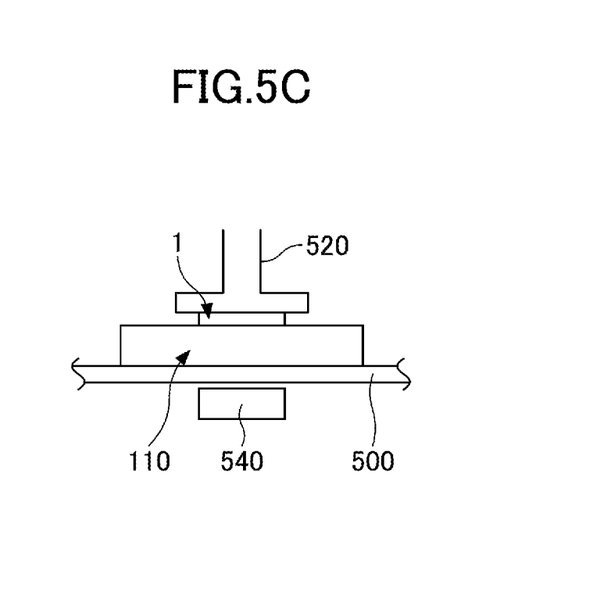
FIG. 5C is a drawing illustrating the example of a procedure for fusing the strain gauge to the flexure element (part 3).

Subsequently, as illustrated in FIG. 5C, portions of the flexure element 110, i.e., a portion in contact with the insulating resin layer 60 of the strain gauge 1 and a portion provided with the anisotropic conductive film, are locally heated by an instantaneous heater 540 provided below the conveyor 500. At the same time, by pressing the jig 520 further downward, the strain gauge 1 is pressed against the flexure element 110, and the insulating resin layer 60 of the strain gauge 1 and the upper surface 110a of the flexure element 110 are pressure-bonded, and the terminal section 41 and the electrode 130 are pressure-bonded via the anisotropic conductive film. Accordingly, thermoplastic polyimide constituting the insulating resin layer 60 is melted. Furthermore, the anisotropic conductive film cures.

The heating temperature is, for example, about 220° C. to 260° C., the pressurizing force is, for example, about 1 N/m$^2$ to 2 N/m$^2$, and the time for which heating and pressurizing is performed is, for example, about 5 seconds to 20 seconds.

Figure 5D:
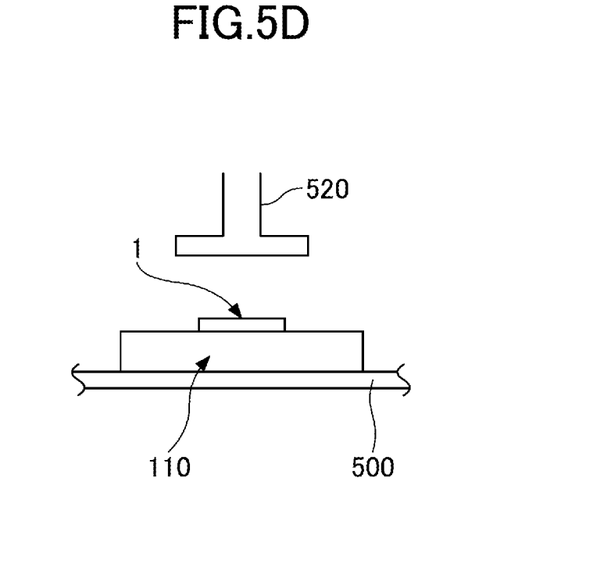
FIG. 5D is a drawing illustrating the example of a procedure for fusing the strain gauge to the flexure element (part 4).

Subsequently, cooling is performed. Specifically, as illustrated in FIG. 5D, the holding of the strain gauge 1 by the jig 520 is removed, and the strain gauge 1 and the flexure element 110 are cooled. Accordingly, thermoplastic polyimide constituting the insulating resin layer 60 is solidified, and the strain gauge 1 is fused to the flexure element 110 with a high bonding strength.

As a result, the sensor module 3 as illustrated in FIG. 4 is produced. Heating and pressurizing of the insulating resin layer 60 and heating and pressurizing of the anisotropic conductive film may be performed independently. In this case, the heating temperature and the pressurizing time can be set independently.

In this manner, the sensor module 3 has such a structure that the insulating resin layer 60 side of the strain gauge 1 is attached to the flexure element 110. In the strain gauge 1, the insulating resin layer 60 is the thermoplastic polyimide layer, and therefore, as explained in the first embodiment, the work efficiency can be improved when the insulating resin layer 60 side is attached to the flexure element 110.

Furthermore, in the method for attaching the strain gauge 1 to the flexure element 110 explained with reference to FIG. 5A to FIG. 5D, only the vicinity around the contact surface between the insulating resin layer 60 of the strain gauge 1 and the flexure element 110 is locally heated to fuse the strain gauge 1 to the flexure element 110. Therefore, according to the attachment method of the present embodiment, the amount of energy required for heating can be greatly reduced, as compared with a conventional process that includes placing a strain gauge and a flexure element, fixed by a jig, into a furnace and heating the entirety of the strain gauge, the flexure element, and the jig at 150 degrees or more for one hour or more.

The insulating resin layer 60 provided in the strain gauge 1 can be fused to the flexure element 110 by performing heating and pressurizing for a short period of time, and therefore, the attachment step for attaching the strain gauge 1 to the flexure element 110 can be achieved as one-piece-at-a-time production process using the jig 520 and the instantaneous heater 540. Such a one-piece-at-a-time attachment step is much simpler than the heating and pressurizing step of the conventional process that is performed as a batch process including a heating step for one hour or more.

The heating and pressurizing step of the conventional process includes pressurizing the strain gauge and the flexure element while holding them with the jig, heating the strain gauge and the flexure element, which are integrally held, in the furnace, retrieving the strain gauge and the flexure element from the furnace after heating, and detaching the jig.

When the anisotropic conductive film is used for electrical connection between the terminal section 41 of the strain gauge 1 and the electrode 130 of the flexible print circuit board 120, the terminal section 41 and the electrode 130 can be connected easily, and therefore, as compared with the case where they are connected with a solder or the like, the work efficiency can be improved greatly.

Third Embodiment

In the third embodiment, an example of a strain gauge having a flexible print circuit board is shown. Specifically, the third embodiment is an example where an object to which the strain gauge according to the first embodiment is attached is a flexible print circuit board. In the third embodiment, explanation about substantially the same components as in the above-described embodiments may be omitted.

Figure 6:
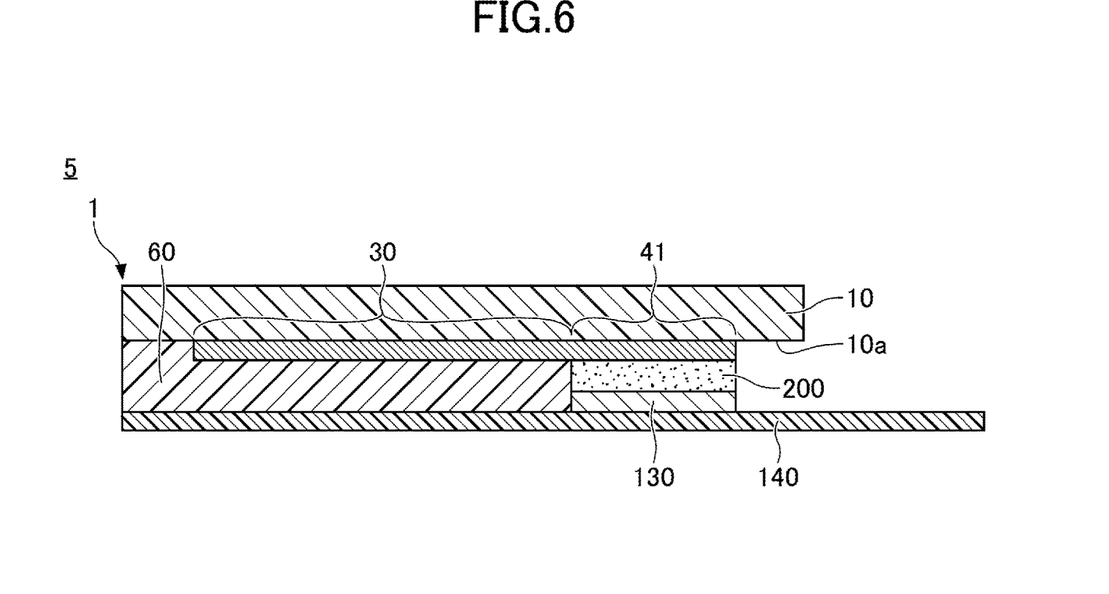
FIG. 6 is a cross-sectional view illustrating an example of a sensor module according to a third embodiment.

FIG. 6 is a cross-sectional view illustrating an example of the sensor module according to the third embodiment. As shown in FIG. 6, a sensor module 5 includes a strain gauge 1 and a flexible print circuit board 140. An electrode 130 is formed on the flexible print circuit board 140.

The terminal section 41 of the strain gauge 1 is electrically connected to the electrode 130 on the flexible print circuit board 140 via the conductive adhesive layer 200. The conductive adhesive layer 200 is, for example, an anisotropic conductive film. The insulating resin layer 60 of the strain gauge 1 is fused to a portion of an area of the flexible print circuit board 140 where the electrode 130 is not formed.

The insulating resin layer 60 and the flexible print circuit board 140 can be fused by, for example, placing the flexible print circuit board 140, instead of the flexure element 110, on a conveyor 500 in the process explained with reference to FIG. 5A to FIG. 5D. Because the insulating resin layer 60 is a thermoplastic polyimide layer, the work efficiency can be improved when the insulating resin layer 60 side is attached to the flexible print circuit board 140.

In a plan view, a portion of the flexible print circuit board 140 extends to the outside of the area where the strain gauge 1 is provided. Therefore, for example, an external connection electrode is provided in the area of the flexible print circuit board 140 extending to the outside of the strain gauge 1, so that the strain gauge 1 and the external circuit can be readily electrically connected.

Note that an adhesive layer and a release film may be laminated successively on the back surface side (a side where the electrode 130 is not formed) of the flexible print circuit board 140. Therefore, the sensor module 5 can be readily pasted to the flexure element.

Fourth Embodiment

In the fourth embodiment, an example of a sensor module in which the sensor module 5 is pasted to a flexure element is shown. In the fourth embodiment, explanation about substantially the same components as in the above-described embodiments may be omitted.

Figure 7:
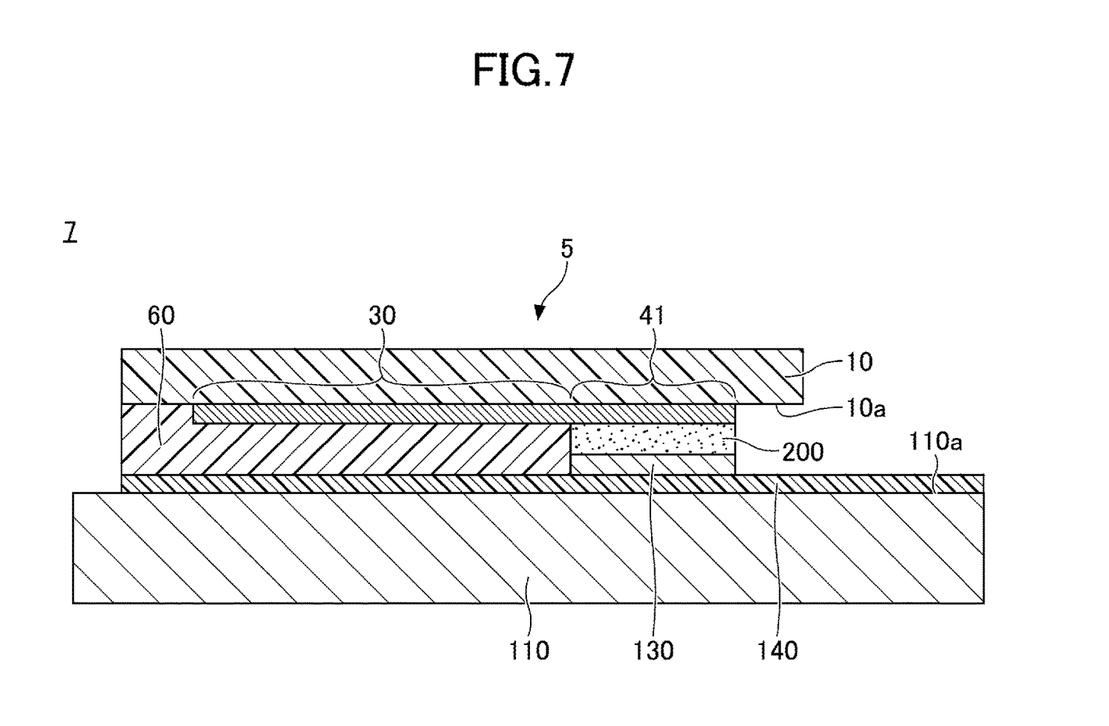
FIG. 7 is a cross-sectional view illustrating an example of a sensor module according to a fourth embodiment.

FIG. 7 is a cross-sectional view illustrating an example of a sensor module according to the fourth embodiment. As shown in FIG. 7, a sensor module 7 includes the sensor module 5 and a flexure element 110. A side of the flexible print circuit board 140 opposite from a side where the electrode 130 is formed is pasted to the upper surface 110a of the flexure element 110.

In a plan view, a portion of the flexible print circuit board 140 extends to the outside of the area where the strain gauge 1 is provided. Therefore, for example, an external connection electrode is provided in the area of the flexible print circuit board 140 extending to the outside of the strain gauge 1, so that the strain gauge 1 and the external circuit can be readily electrically connected.

The preferred embodiment and the like have been described above in detail, but are not limited thereto. Various modifications and alternatives to the above embodiment and the like can be made without departing from a scope set forth in the claims.

This international application claims priority to Japanese Patent Application No. 2019-181206 filed on Oct. 1, 2019, and the entire contents of Japanese Patent Application No. 2019-181206 are incorporated into this international application by reference.

REFERENCE SIGNS LIST

1 strain gauge,
3, 5, 7 sensor module,
10 substrate,
10a upper surface,
30 resistor,
41 terminal section,
60 insulating resin layer,
110 flexure element,
120, 140 flexible print circuit board,
130 electrode,
200 conductive adhesive layer

The invention claimed is:

1. A sensor module comprising:
a strain gauge; and
a flexure element configured to transmit strain to the strain gauge,
wherein the strain gauge includes
a substrate made from resin and having flexibility;
a resistor formed on a surface of the substrate; and
an insulating resin layer covering the resistor,
wherein the insulating resin layer is a thermoplastic polyimide layer, and
wherein the insulating resin layer is fused to the flexure element.

2. The sensor module according to claim 1, wherein a thickness of the insulating resin layer is 5 µm or more and 7 µm or less.

3. The sensor module according to claim 1, further comprising:
a flexible print circuit board on which an electrode is formed,
wherein the strain gauge includes a terminal section exposed from the insulating resin layer, the terminal section being electrically connected to the resistor, and
the terminal section is electrically connected to the electrode via a conductive adhesive layer.

4. The sensor module according to claim 3, wherein the conductive adhesive layer is an anisotropic conductive film.

5. The sensor module according to claim 1, further comprising:
a flexible print circuit board on which an electrode is formed,
wherein the strain gauge includes a terminal section exposed from the insulating resin layer, the terminal section being electrically connected to the resistor,
the terminal section is electrically connected to the electrode via a conductive adhesive layer, and
the insulating resin layer is fused to an area of the flexible print circuit board where the electrode is not formed.

6. The sensor module according to claim 5,
wherein a side of the flexible print circuit board opposite from a side where the electrode is formed is pasted to the flexure element.

* * * * *